(12) United States Patent
Kao

(10) Patent No.: US 6,580,617 B2
(45) Date of Patent: Jun. 17, 2003

(54) FIXING RACK FOR POSITIONING A STORAGE DEVICE INTO A COMPUTER

(75) Inventor: Ming-Hui Kao, Taipei Hsien (TW)

(73) Assignee: Wistron Corporation, Taipei Hsien (TW)

( * ) Notice: Subject to any disclaimer, the term of this patent is extended or adjusted under 35 U.S.C. 154(b) by 0 days.

(21) Appl. No.: 10/063,081

(22) Filed: Mar. 17, 2002

(65) Prior Publication Data

US 2003/0067753 A1 Apr. 10, 2003

(30) Foreign Application Priority Data

Oct. 9, 2001 (TW) ........................................ 90125021 A

(51) Int. Cl.[7] ................................................ H05K 5/00
(52) U.S. Cl. ...................... 361/759; 361/747; 361/825; 361/684; 361/796
(58) Field of Search ................................. 361/759, 801, 361/810, 825, 684, 685, 686, 732, 747, 740, 753, 796

(56) References Cited

U.S. PATENT DOCUMENTS 5,481,431 A * 1/1996 Siahpolo et al. ............ 104/207

* cited by examiner

Primary Examiner—David Martin
Assistant Examiner—Hung Bui
(74) Attorney, Agent, or Firm—Winston Hsu

(57) ABSTRACT

A detachable fixing rack is provided for positioning a storage device on the housing of a computer. The fixing rack includes a main body, an engaging element, and a rotating element. After the engaging element of the fixing rack is placed against a locating element of the housing, the rotating element can be used to lock the engaging element against the locating element, securing the fixing rack to the housing. If the rotating element is turned in the opposite direction, the engaging element separates from the locating element and the fixing rack can be separated from the housing.

20 Claims, 4 Drawing Sheets

FIXING RACK FOR POSITIONING A STORAGE DEVICE INTO A COMPUTER

BACKGROUND OF INVENTION

1. Field of the Invention

The present invention relates to a fixing rack for positioning a storage device on a housing of a computer, and more specifically, a detachable fixing rack for positioning a storage device on a housing of a computer.

2. Description of the Prior Art

A computer usually has several storage devices such as a CD-ROM drive, a DVD-ROM drive, a floppy disc drive, a CD-ROM burner, a DVD-ROM burner, and a hard disc drive used to access data. To position a storage device inside the computer, a manufacturer positions the storage device within the fixing rack, and then the user attaches the fixing rack to the housing of the computer. This prevents the storage device from wobbling due to the rotation inertia.

Please refer to FIG. 1. FIG. 1 is an exploded view of a storage device and a fixing rack attached to a housing of a computer 100 according to the prior art. As shown in FIG. 1, the computer 100 comprises a housing 102, a fixing rack 106, and a storage device 108. The fixing rack 106 and the storage device 108 are both disposed on an inner side 104 of the housing 102. The housing 102 has two fixing openings 110a and 110b. The fixing rack 106 comprises a bottom plate 106a, and side plates 106b and 106c positioned at two sides of the bottom plate 106a vertically and parallel to each other. Therefore, the bottom plate 106a and the side plates 106b, 106c form a U-shaped structure which is concave upward. Furthermore, the bottom plate 106a has two openings 112a and 112b corresponding to the fixing openings 110a and 110b of the housing 102. The side plates 106b and 106c also have openings 114a, 114b and 116a, 116b. Additionally, the storage device 108 comprises two parallel sides 108a and 108b that have threaded openings 118a, 118b and 120a, 120b corresponding to the openings 114a, 114b and 116a, 116b of the fixing rack 106.

When a user wishes to position the storage device 108 inside the computer 100, the fixing rack 106 must be first placed on the inner side 104 of the housing 102, as shown by arrow 150, so that the openings 112a, 112b are exactly lined up with the fixing openings 110a, 110b. Two screws (not shown) are then respectively inserted through the openings 112a and 112b and the openings 110a and 110b, attaching the fixing rack 106 to the housing 102 of the computer 100.

Next, the storage device 108 is pushed inside the fixing rack 106, in the direction of an arrow 160, so that the fixing openings 118a, 118b, 120a, and 120b are lined up with the openings 114a, 114b, 116a, and 116b respectively. The user now screws four screws (not shown) through the openings 114a, 114b, 116a, and 116b into the threaded openings 118a, 118b, 120a, and 120b respectively, attaching the storage device 108 within the computer 100 via the fixing rack 106.

Please notice that the user must employ a screwdriver or other auxiliary tool to install or detach the fixing rack 106 and the storage device 108 to or from the computer 100. If the storage device 108 needs be replaced, the user must spend a lot of extra time screwing or unscrewing the screws to install or detach the fixing rack 106 or the storage device 108. Therefore, it is very inconvenient for the user to install or detach the fixing rack 106 and the storage device 108 to or from the computer 100.

SUMMARY OF INVENTION

It is therefore a primary objective of the claimed invention to provide a fixing rack for positioning a storage device on a housing of a computer, which has an engaging element and a rotating element to secure the fixing rack detachably to the housing, reducing time and inconvenience while installing or detaching the storage device to or from the computer.

The claimed invention, briefly summarized, discloses a detachable fixing rack for positioning a storage device on a housing of a computer. The fixing rack includes a main body, an engaging element, and a rotating element. After the fixing rack is placed adjacent to a locating element of the housing, the rotating element can be used to lock the fixing rack on the housing. Additionally, when the rotating element is rotated in the opposite direction, the lock is released and the fixing rack can be separated from the housing.

It is an advantage of the claimed invention that the fixing rack has an engaging element and a rotating element, allowing a user to attach or remove the fixing rack to or from the housing when installing or removing the storage device inside or from the computer. This tool-less and screw-less design increases the convenience and reduces the time and know-how necessary to install or remove the storage device in or from the computer.

These and other objectives and advantages of the claimed invention will no doubt become obvious to those of ordinary skill in the art after reading the following detailed description of the preferred embodiment that is illustrated in the various figures and drawings.

DETAILED DESCRIPTION

Figure 1:
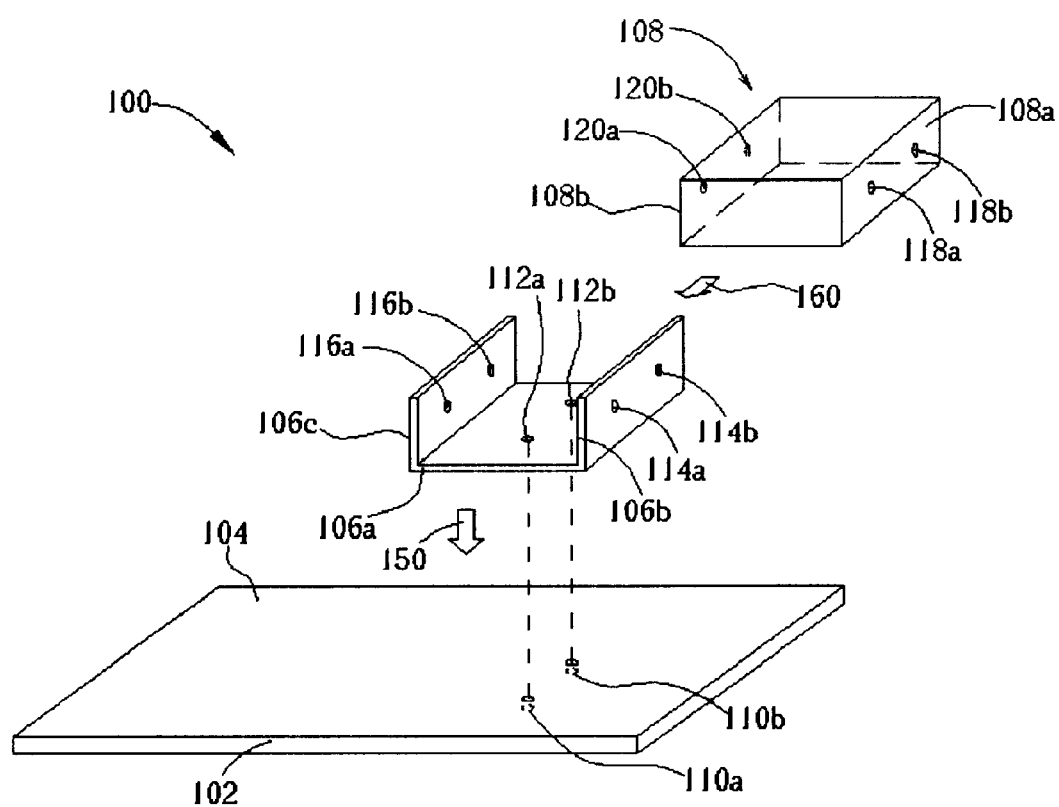
FIG. 1 is an exploded view of a storage device and a fixing rack on a housing of a computer according to the prior art.
Figure 2:
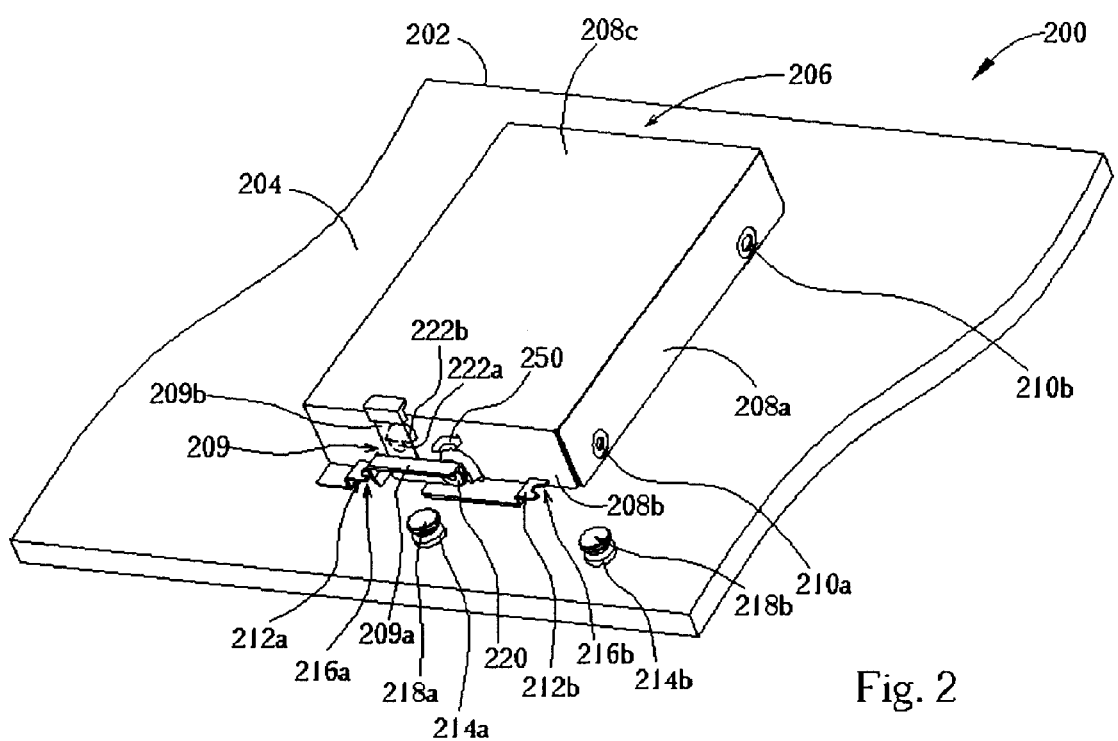
FIG. 2 is a diagram of a fixing rack disposed on a housing of a computer according to the present invention.

Please refer to FIG. 2. FIG. 2 is a diagram of a fixing rack disposed on a housing of a computer 200 according to the present invention. As shown in FIG. 2, the computer 200 comprises a housing 202 and a fixing rack 206. The fixing rack 206 is detachably disposed on an inner side 204 of the housing 202 for positioning a storage device (not shown) so as to fix the storage device inside the computer 200. The fixing rack 206 comprises a main body 208, a rotating element 209, and an engaging element. The main body 208 comprises a top plate 208c and two side plates 208a and 208b vertically disposed beneath adjacent sides of the top plate 208c. The side plate 208a has two openings 210a and 210b to lock the storage device inside the fixing rack 206 by passing screws through the openings 210a and 210b. The engaging element comprises two locking pieces 212a and 212b placed on the side plate 208b for engaging a locating element. The locating element comprises two positioning posts 214a and 214b disposed on the inner side 204 of the housing 202 to position the fixing rack 206 on the inner side 204 of the housing 202. Of course, the locking pieces 212a and 212b can be monolithically formed with the main body 208.

A right end of the locking piece 212a and a right end of the locking piece 212b have recesses 216a and 216b respectively. The positioning posts 214a and 214b have neck portions 218a and 218b for engaging with the recesses 216a and 216b. Therefore, when installing the fixing rack 206, the neck portions 218a and 218b are engaged with and pushed tightly against the locking pieces 212a and 212b, preventing vertical wobble and firmly attaching to the fixing rack 206.

Additionally, the rotating element 209, comprising a fixing bolt 209a and an elastic piece 209b, is rotatably disposed on the side plate 208b and placed between the locking pieces 212a and 212b and nailed to the side plate 208b by an axial nail 220. The axial nail 220 functions as an axis for the rotating element 209 to rotate clockwise or counterclockwise in the directions of an arrow 250. A right end of the fixing bolt 209a is connected to the side plate 208b via the axial nail 220. An end of the elastic piece 209b is vertically fixed near to another end of the fixing bolt 209a. Another end of the elastic piece 209b protrudes over the top plate 208c of the main body 208 to be used as a handle for being pulled by a user. The elastic piece 209b further comprises a protruding portion 222a that engages with a protruding portion 222b of the side plate 208b, for securing rotating element 209 in a locked position.

When the user wishes to attach the fixing rack 206 onto the inner side 204 of the housing 202, the fixing bolt 209a is rotated counter-clockwise along a direction of the arrow 250 by pulling the elastic piece 209b, rotating the fixing bolt 209a around the axial nail 220, pushing an end of the fixing bolt 209a against the locking piece 214b. When the user wishes to detach the fixing rack 206 from the inner side 204 of the housing 202, the fixing bolt 209a is rotated clockwise along a direction of the arrow 250 by pulling the elastic piece 209b, rotating the fixing bolt 209a around the axial nail 220, separating the fixing bolt 209a from the locking piece 214b and releasing the fixing rack 206.

Figure 3:
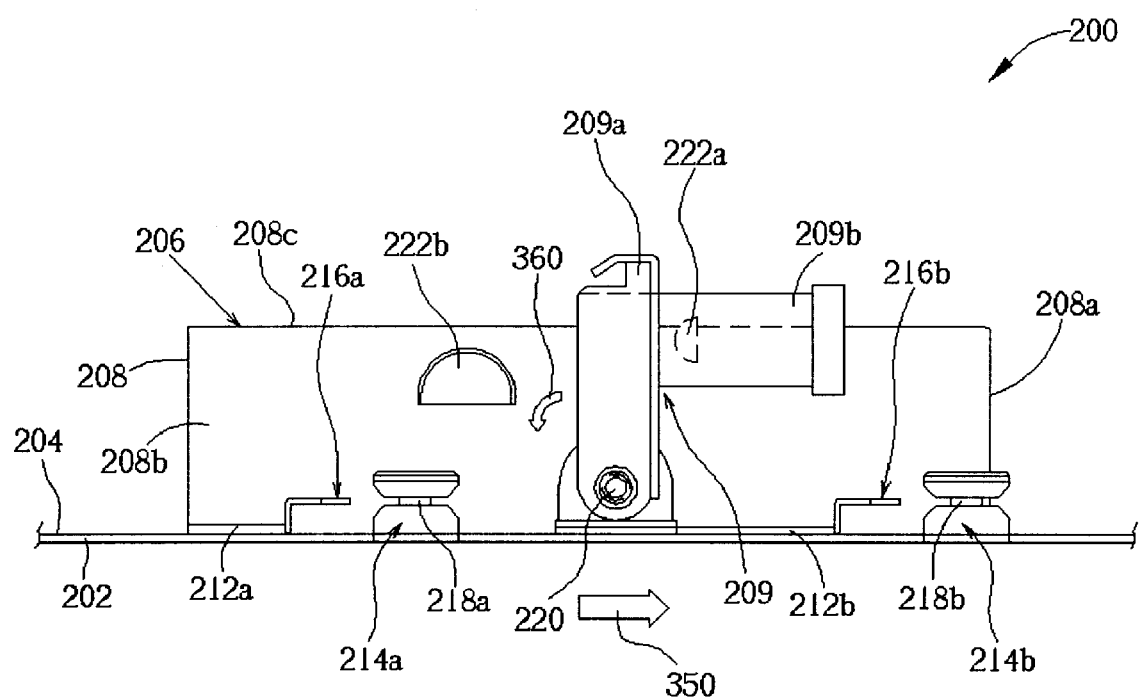
FIG. 3 is a side view of a rotating element depicted in FIG. 2 when the fixing bolt rotates to an erect state and the elastic piece rotates to a transverse state.

Please refer to FIG. 3. FIG. 3 is a side view of the rotating element 209 depicted in FIG. 2 when the fixing bolt 209a rotates to a vertical state and the elastic piece 209b rotates to a horizontal state. As shown in FIG. 3, during installation the fixing rack 206 is pushed along a direction of an arrow 350 on the inner side 204 of the housing 202 so as to insert the locking pieces 212a and 212b into the positioning posts 214a and 214b. The neck portions 218a and 218b are therefore engaged with the recesses 216a and 216b respectively. Then, the user pushes the elastic piece 209b so as to permit the axial nail 220 functioning as the axis for the fixing bolt 209a to rotate counter-clockwise along a direction of an arrow 360. After the fixing bolt 209a rotates to the horizontal state and the elastic piece 209b rotates to the vertical state, the end of the fixing bolt 209a is pushed against the positioning post 214a, and the protruded portion 222a of the elastic piece 209b is engaged with the protruded portion 222b of the side plate 208b so as to engage the fixing rack 206 on the inner side 204 of the housing 202 (shown in FIG. 4). Finally, a desired storage device can be positioned inside the fixing rack 206 so as to be fixed within the computer 200.

Figure 4:
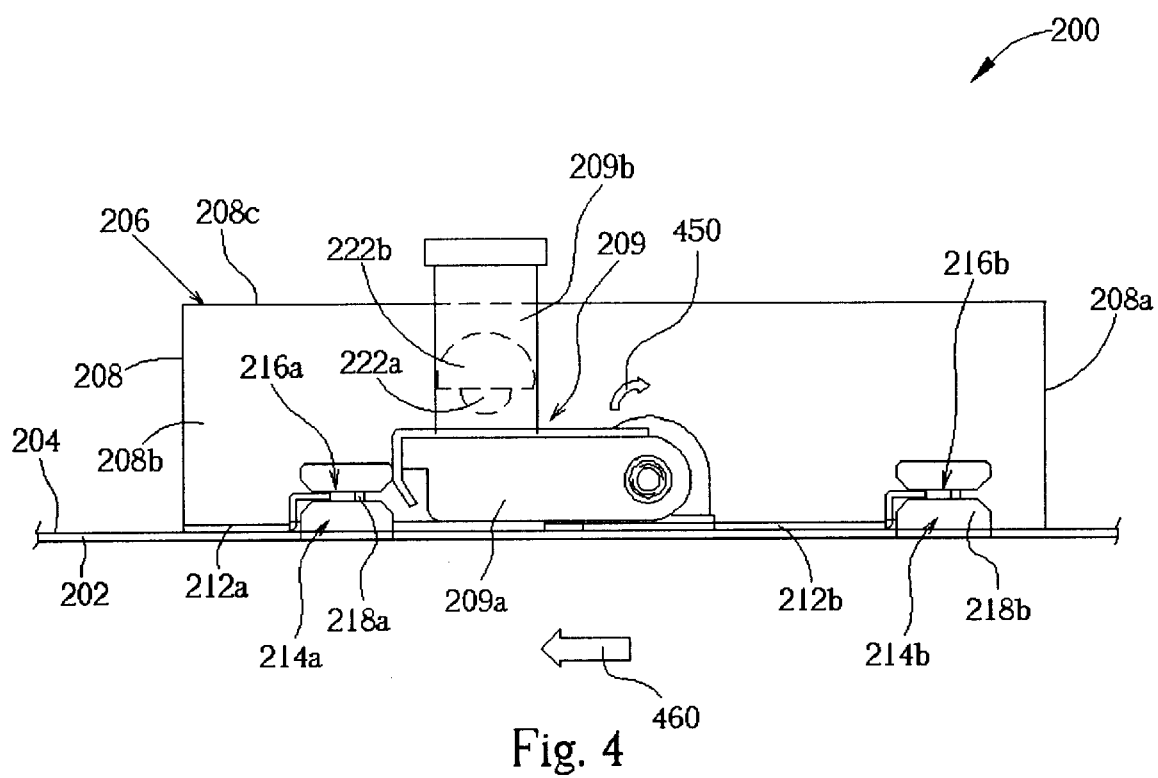
FIG. 4 is side view of fixing rack attached to the housing of the computer according to the present invention.

Please refer to FIG. 4. FIG. 4 is side view of the fixing rack 206 attached to the housing 202 of the computer 200 according to the present invention. As shown in FIG. 4, when the fixing rack is to be separated from the inner side 204 of the housing 202, the user needs to pull the elastic piece 209b outward, allowing the protruded portion 222a to separate from the protruded portion 222b. After the elastic piece 209b is pulled outward, the fixing bolt 209a is rotated clockwise along a direction of an arrow 450 to separate from the positioning post 214a. Then, the user can pull the fixing rack 206 in the direction of an arrow 460, separating the locking pieces 212a and 212b from the positioning posts 214a and 214b. This separates the neck portions 218a and 218b from the recesses 216a and 216b respectively (as shown in FIG. 3). Therefore, the fixing rack 206 is separated from the inner side 204 of the housing 202.

Technology of the present invention is not limited to the above-mentioned description. For example, a user can install an engaging element and a rotating element on another side plate opposite to the side plate 208b of the main body 208 for engaging with another locating element on the inner side 204 to attach the fixing rack 206 on the housing 202. The elastic piece 209b can be riveted with the fixing bolt 209a, the positioning posts can both be riveted onto the housing. Furthermore, a soft pad bent toward the side plate 208b can be disposed on an end of the elastic piece 209b for a user to grip. An end of the fixing bolt can alternately have a bending portion for strengthening the effect of the fixing bolt 209a pushing against the positioning post 214a. Of course, the present invention computer 200 can be a desktop computer, a notebook computer or a server, and the storage device can be a CD-ROM drive, a DVD-ROM drive, a soft disc drive, a CD-ROM burner, a DVD-ROM burner, a hard disc drive or anther storage device.

In contrast to the prior art, the present invention fixing rack has an engaging element and a rotating element so that a user can fix the fixing rack detachably on the housing so as to reduce time and inconvenience while installing or detaching the storage device inside or from the computer.

Those skilled in the art will readily observe that numerous modifications and alterations of the device may be made while retaining the teachings of the invention.

Accordingly, the above disclosure should be construed as limited only by the metes and bounds of the appended claims.

What is claimed is:

1. A fixing rack detachably disposed on a housing of a computer for positioning a storage device, the housing having at least one locating element, the locating element comprising a first positioning post and a second positioning post having a first neck portion and a second neck portion respectively, the fixing rack comprising;

a main body for positioning the storage device, the main body having at least one side plate:

at least one engaging element mounted on the side plate for engaging with the locating element, the engaging element comprising a first locking piece and a second locking piece respectively disposed near to a first end and a second end of the side plate and having a first recess for engaging with the first neck portion and a second recess for engaging with the second neck portion;

at least one rotating element rotatably installed on the side plate for pushing against the locating element, the rotating element comprising a first end rotatably fixed on the side plate and a second end for pushing against the first positioning post; and an elastic piece vertically fixed to the rotating element for being pulled to rotate the rotating element such that when the rotating element is pushed against the first positioning post, a protruded portion of the elastic piece will engage with a protruded portion of the side plate;

wherein after the fixing rack is pushed toward the locating element and the first looking piece and the second locking piece are engaged with the first positioning post and the second positioning post, the rotating element is capable of being rotated to push against the first positioning post to fix the fixing rack on the housing; and after the rotating element is rotated to separate from the first positioning post, the fixing rack is capable of being separated from the housing by separating the first locking piece and the second locking piece from the first positioning post and the second positioning post respectively.

2. The fixing rack of claim 1 wherein the elastic piece is riveted onto the rotating element.

3. The fixing rack of claim 1 wherein the first and second positioning posts are riveted onto the housing.

4. The fixing rack of claim 1 wherein the rotating element is nailed onto the side plate.

5. The fixing rack of claim 1 wherein the storage device is an optical disc drive.

6. The fixing rack of claim 1 wherein the storage device is a hard disc drive.

7. The fixing rack of claim 1 wherein the computer is a desktop computer.

8. The fixing rack of claim 1 wherein the computer is a notebook computer.

9. The fixing rack of claim 1 wherein the computer is a server.

10. A computer comprising:
   a housing comprising a first positioning post and a second positioning post, the first positioning post having a first neck portion, the second positioning post having a second neck portion;
   a fixing rack detachably disposed on the housing for positioning a storage device, the fixing rack comprising:
   a main body for positioning the storage device, the main body having a side plate;
   a first locking piece disposed near to a first end of the side plate, the first locking piece having a first recess for engaging with the first neck portion;
   a second locking piece disposed near to a second end of the side plate, the second locking piece having a second recess for engaging with the second neck portion:
   a rotating element having a first end rotatably fixed on the side plate and a second end pushing against the first positioning post; and
   an elastic piece vertically fixed to the rotating element for being pulled to rotate the rotating element such that when the rotating element is pushed against the first positioning post, a protruded portion of the elastic piece will engage with a protruded portion of the side plate;
   wherein after the first locking piece and the second locking piece are engaged with the first positioning post and the second positioning post, the rotating element is capable of being rotated to push against the first positioning post so as to fix the fixing rack on the housing; and after the rotating element is rotated to separate from the first positioning post, the fixing rack is capable of being separated from the housing by separating the first locking piece and the second locking piece from the first positioning post and the second positioning post respectively.

11. The computer of claim 10 wherein the elastic piece is riveted onto the rotating element.

12. The computer of claim 10 wherein the first and second positioning posts are riveted onto the housing.

13. The computer of claim 10 wherein the rotating element is nailed onto the side plate.

14. The computer of claim 10 wherein the storage device is an optical disc drive.

15. The computer of claim 10 wherein the storage device is a hard disc drive.

16. The computer of claim 10 wherein the computer is a desktop computer.

17. The computer of claim 10 wherein the computer is a notebook computer.

18. The computer of claim 10 wherein the computer is a server.

19. A fixing rack for detachably fixing a storage device to a housing of a computer, the housing comprising a first positioning post having a first neck portion and a second positioning post having a second neck portion, the fixing rack comprising:
   a main body for positioning the storage device, the main body having a side plate;
   a first locking piece disposed on the side plate, the first locking piece having a first recess for engaging with the first neck portion;
   a second locking piece disposed on the side plate, the second locking piece having a second recess for engaging with the second neck portion; and
   a fixing bolt having a first end and a second end, the first end rotatably fixed on the side plate between the first and the second locking pieces, the fixing bolt being capable of being rotated such that after the first recess is engaged with the first neck portion and the second recess is engaged with the second neck portion, the second end of the fixing bolt is pushed against the first positioning post to fix the fixing rack to the housing;
   wherein when the fixing bolt is rotated such that the second end of the fixing bolt is separated from the first positioning post, the fixing rack may be separated from the housing by disengaging the first recess from the first neck portion and the second recess from the second neck portion.

20. The fixing rack of claim 19 wherein the fixing rack further comprises an elastic piece vertically fixed to the fixing bolt for being pulled to rotate the fixing bolt, when the fixing bolt is pushed against the first positioning post, a protruded portion of the elastic piece will engage with a protruded portion of the side plate.

* * * * *